United States Patent
Lee et al.

(10) Patent No.: US 12,313,392 B2
(45) Date of Patent: May 27, 2025

(54) APPARATUS AND METHOD FOR MEASURING THE GAP

(71) Applicant: SEMES Co., Ltd., Chungcheongnam-do (KR)

(72) Inventors: Chung Woo Lee, Gyeonggi-do (KR); Sung Youn Jeon, Chungcheongnam-do (KR); In Kyu Park, Gyeonggi-do (KR); Yong Seok Jang, Chungcheongnam-do (KR)

(73) Assignee: SEMES CO., LTD, Chungcheongnam-Do (KR)

( * ) Notice: Subject to any disclaimer, the term of this patent is extended or adjusted under 35 U.S.C. 154(b) by 657 days.

(21) Appl. No.: 17/533,511

(22) Filed: Nov. 23, 2021

(65) Prior Publication Data

US 2022/0170734 A1    Jun. 2, 2022

(30) Foreign Application Priority Data

Nov. 30, 2020    (KR) .......................... 10-2020-0163892

(51) Int. Cl.
*G01B 11/02*    (2006.01)
*G06T 7/00*    (2017.01)
(Continued)

(52) U.S. Cl.
CPC .......... *G01B 11/026* (2013.01); *G06T 7/0004* (2013.01); *H01L 21/67742* (2013.01); *H01L 22/12* (2013.01); *H01L 22/34* (2013.01);
(Continued)

(58) Field of Classification Search
CPC ....... G01B 11/026; G01B 11/14; G01B 11/02; G01B 5/0004; G06T 7/0004; G06T 7/60;
(Continued)

(56) References Cited

U.S. PATENT DOCUMENTS 4,880,307 A * 11/1989 Endo ....................... G01S 7/497
                                                         356/623
10,665,490 B2    5/2020 Lee et al.
(Continued)

FOREIGN PATENT DOCUMENTS

CN    106225702 A  * 12/2016  ............. G01B 11/14
KR    20050073154 A    7/2005
(Continued)

OTHER PUBLICATIONS

Korean Written Decision on Registration for Korean Application No. 10-2020-0163892, dated Jun. 15, 2023 with translation, 4 pages.

*Primary Examiner* — Catherine T. Rastovski
*Assistant Examiner* — Lal C Mang
(74) *Attorney, Agent, or Firm* — Buchanan Ingersoll & Rooney PC

(57) ABSTRACT

Provided is a gap measuring method capable of accurately measuring a gap between adjacent members. The gap measuring method includes preparing an equipment to be measured including a first member and a second member, obtaining a first image by capturing the equipment to be measured using a photographing module of a first setting while irradiating a laser to the equipment to be measured, wherein the first image includes a first laser line image corresponding to a surface of the first member and a second laser line image corresponding to a surface of the second member, modifying the photographing module from the first setting to a second setting based on a maximum width of the second laser line image in the first image, obtaining a second image by capturing the equipment to be measured using the photographing module of the second setting while irradiating a laser to the equipment to be measured, and calculating a gap between the first member and the second member (Continued)

based on a discontinuous region between the first laser line image and the second laser line image in the second image.

19 Claims, 10 Drawing Sheets

(51) Int. Cl.
    *H01L 21/66* (2006.01)
    *H01L 21/677* (2006.01)
    *H04N 23/73* (2023.01)
    *H04N 23/76* (2023.01)
(52) U.S. Cl.
    CPC ............ *H04N 23/73* (2023.01); *H04N 23/76* (2023.01); *G06T 2207/10144* (2013.01); *G06T 2207/30164* (2013.01)
(58) Field of Classification Search
    CPC . G06T 2207/10144; G06T 2207/30164; G06T 2207/20068; H01L 21/67742; H01L 22/12; H01L 22/34; H04N 23/73; H04N 23/72; H01J 37/32642
    See application file for complete search history.

(56) References Cited

U.S. PATENT DOCUMENTS

| | | | | |
|---|---|---|---|---|
| 2002/0054204 | A1* | 5/2002 | Ikeda | H04N 1/4005 347/252 |
| 2009/0023086 | A1 | 1/2009 | Kim | |
| 2015/0185464 | A1* | 7/2015 | Karube | H04N 13/275 348/44 |
| 2020/0013657 | A1* | 1/2020 | Lee | H01L 21/67242 |
| 2020/0365594 | A1* | 11/2020 | Taguchi | C23C 16/45551 |
| 2022/0134568 | A1* | 5/2022 | Blank | H01L 21/67742 700/254 |

FOREIGN PATENT DOCUMENTS

| | | |
|---|---|---|
| KR | 20090008941 A | 1/2009 |
| KR | 20130130510 A | 12/2013 |
| KR | 20140028831 A | 3/2014 |
| KR | 20200004684 A | 1/2020 |
| WO | 2020180607 A1 | 9/2020 |

* cited by examiner

Fig. 6
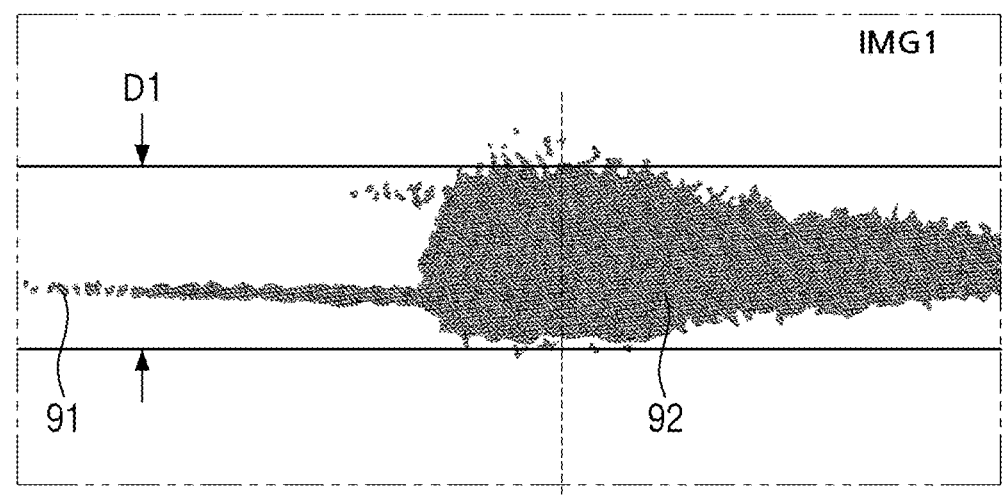
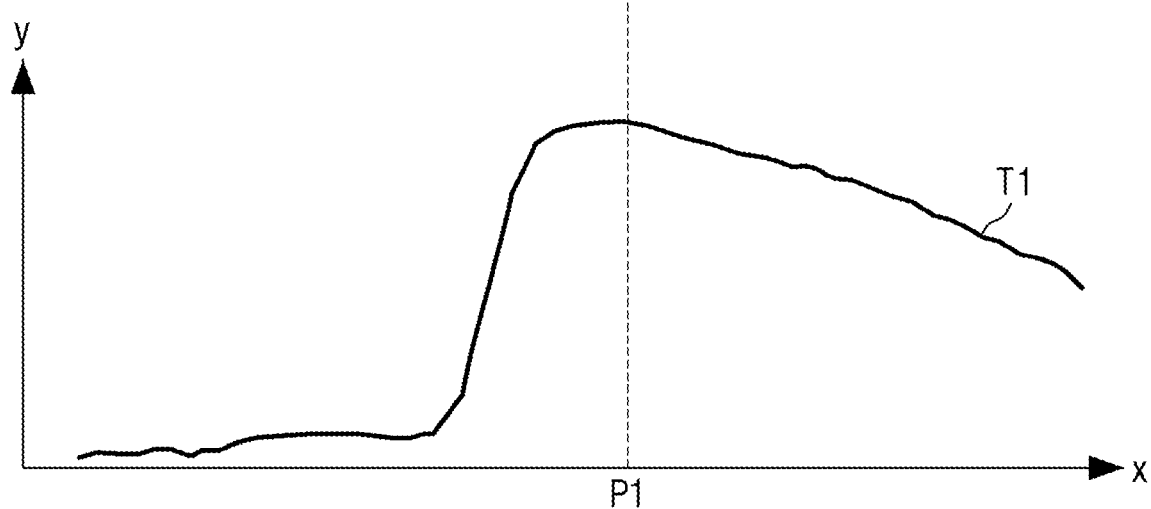

APPARATUS AND METHOD FOR MEASURING THE GAP

CROSS REFERENCE TO RELATED APPLICATION

This application claims the benefit of Korean Patent Application No. 10-2020-0163892, filed on Nov. 30, 2020, in the Korean Intellectual Property Office, the disclosure of which is incorporated herein by reference in its entirety.

FIELD OF THE INVENTION

The present invention relates to an apparatus and method for measuring a gap.

BACKGROUND OF THE INVENTION

The electrostatic chuck includes a support member and an edge ring surrounding the support member. The gap between the support member and the edge ring should be constant. The gap between the support member and the edge ring may be identified by capturing the support member and the edge ring, and the captured image may vary depending on conditions in a chamber, in which the electrostatic chuck is located, reflectivity of an object to be captured, and the like. In this case, it is difficult to accurately capture the gap between the support member and the edge ring.

SUMMARY OF THE INVENTION

An aspect of the present invention is a gap measuring method capable of accurately measuring the gap between adjacent members.

Another aspect of the present invention is a gap measuring apparatus capable of accurately measuring the gap between adjacent members.

The aspects of the present invention are not limited to the aspects mentioned above, and other aspects not mentioned will be clearly understood by those skilled in the art from the following description.

One aspect of the method for measuring the gap of the present invention for achieving the above object comprises preparing an equipment to be measured including a first member and a second member, obtaining a first image by capturing the equipment to be measured using a photographing module of a first setting while irradiating a laser to the equipment to be measured, wherein the first image includes a first laser line image corresponding to a surface of the first member and a second laser line image corresponding to a surface of the second member, modifying the photographing module from the first setting to a second setting based on a maximum width of the second laser line image in the first image, obtaining a second image by capturing the equipment to be measured using the photographing module of the second setting while irradiating a laser to the equipment to be measured, and calculating a gap between the first member and the second member based on a discontinuous region between the first laser line image and the second laser line image in the second image.

Another aspect of the method for measuring the gap of the present invention for achieving the above object comprises preparing an equipment to be measured including an edge ring and a support member disposed inside the edge ring, placing, by a robot arm, a vision wafer on the equipment to be measured, wherein the vision wafer includes a light emitting module capable of irradiating a laser to the equipment to be measured, and a photographing module capable of capturing the equipment to be measured, obtaining a first image by capturing the equipment to be measured using a photographing module of a first setting while the light emitting module irradiates a laser to the equipment to be measured, wherein the first image includes a first laser line image corresponding to a surface of the edge ring and a second laser line image corresponding to a surface of the support member, calculating a maximum width of the second laser line image in the first image, increasing a camera shutter speed of the photographing module or decreasing a gain based on the maximum width being greater than an upper limit of a preset first range, and decreasing a camera shutter speed of the photographing module or increasing a gain based on the maximum width being smaller than a lower limit of a preset first range.

One aspect of the apparatus for measuring the gap of the present invention for achieving the above object comprises a measurement unit including a light emitting module and a photographing module, and an analysis unit for analyzing an image captured by the measurement unit, wherein the measurement unit obtains a first image by capturing an equipment to be measured including a first member and a second member using a photographing module of a first setting while irradiating a laser to the equipment to be measured with the light emitting module, wherein the first image includes a first laser line image corresponding to a surface of the first member and a second laser line image corresponding to a surface of the second member, wherein the analysis unit determines whether to change a setting of the photographing module based on a maximum width of the second laser line image in the first image, wherein the analysis unit instructs the measurement unit to modify the photographing module from the first setting to the second setting, wherein the measurement unit obtains a second image by capturing the equipment to be measured using the photographing module of the second setting while irradiating a laser to the equipment to be measured with the light emitting module, wherein the analysis unit calculates a gap between the first member and the second member based on a discontinuous region between the first laser line image and the second laser line image in the second image.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIG. 6 is a diagram for describing a first image obtained in step S510 of FIG. 4;

DETAILED DESCRIPTION OF THE INVENTION

Figure 1:
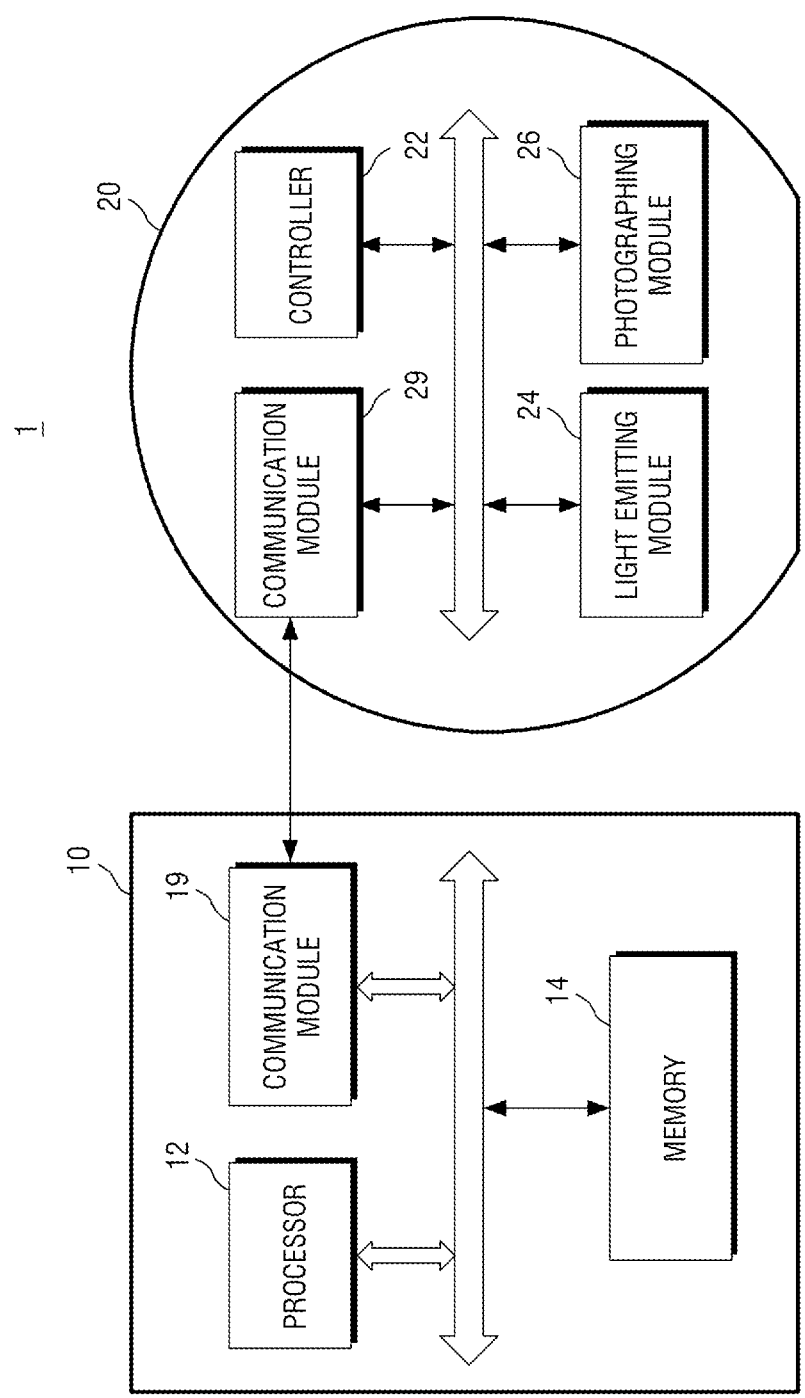
FIG. 1 is a block diagram illustrating a device for measuring a gap according to some embodiments of the present disclosure.

Hereinafter, preferred embodiments of the present invention will be described in detail with reference to the accompanying drawings. Advantages and features of the present invention and methods of achieving them will become apparent with reference to the embodiments described below in detail in conjunction with the accompanying drawings. However, the present invention is not limited to the embodiments described below, but may be implemented in various different forms, and these embodiments are provided only for making the description of the present invention complete and fully informing those skilled in the art to which the present invention pertains on the scope of the invention, and the present invention is only defined by the scope of the claims. Like reference numerals refer to like elements throughout.

When an element or layer is referred to as being "on" another element or layer, not only located directly on the other element or layer is referred to, but also intervening other layers or elements may be included. On the other hand, when an element is referred to as being "directly on" or "immediately on," it indicates that no intervening element or layer is interposed.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present invention.

The terminology used herein is for the purpose of describing the embodiments and is not intended to limit the present invention. In this specification, the singular also includes the plural unless specifically stated otherwise in the phrase. As used herein, "comprises" and/or "comprising" refers to that a mentioned component, step, operation and/or element does not exclude the presence or addition of one or more other components, steps, operation and/or element.

Figure 2:
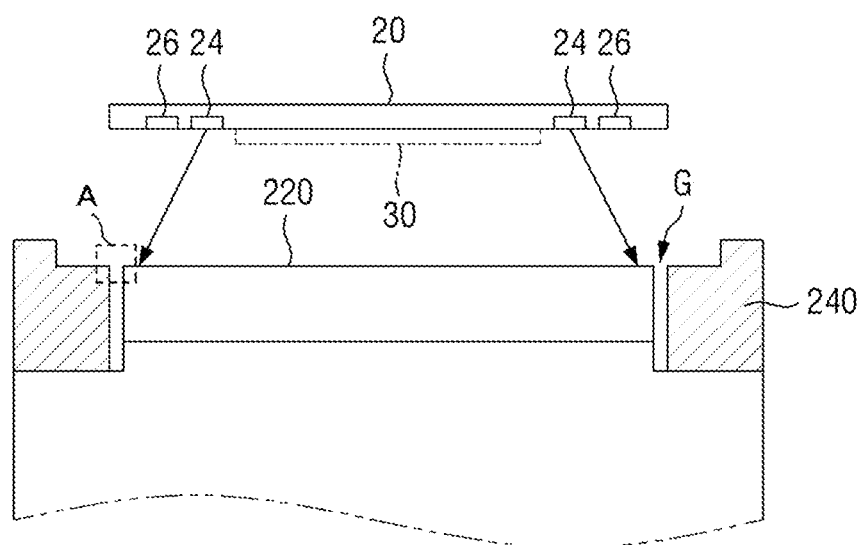
FIG. 2 is a conceptual diagram for describing the operation of the gap measuring device of FIG. 1.
Figure 3:
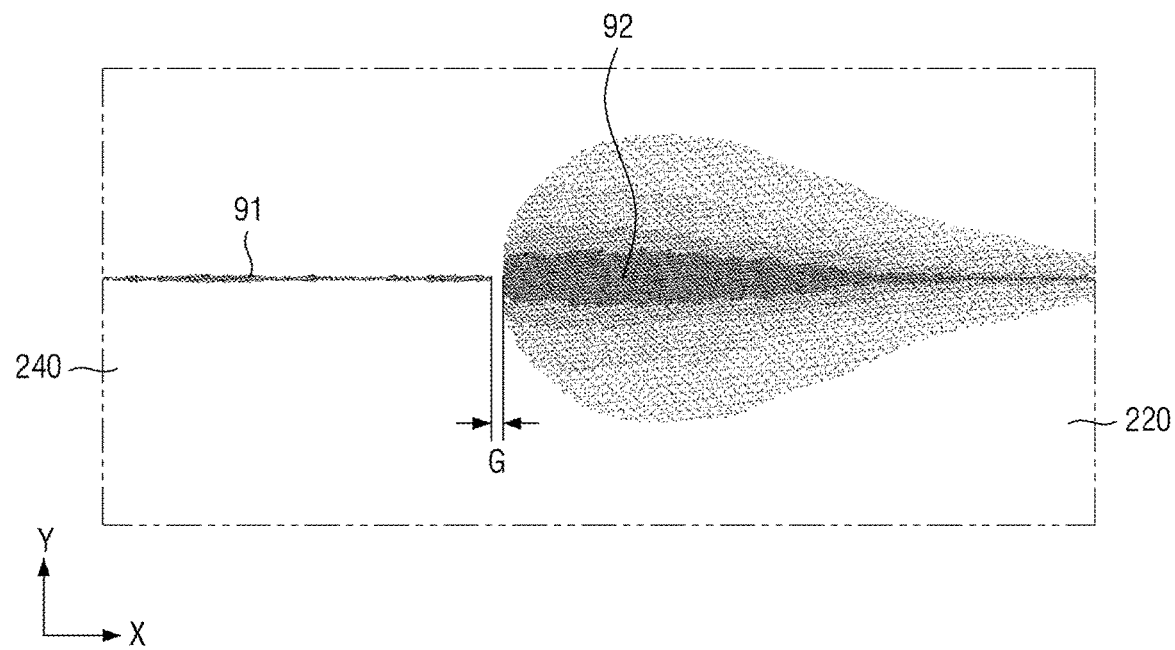
FIG. 3 is a view for describing an image captured by the photographing module of FIG. 1.

FIG. 1 is a block diagram illustrating a device for measuring a gap according to some embodiments of the present disclosure. FIG. 2 is a conceptual diagram for describing the operation of the gap measuring device of FIG. 1. FIG. 3 is a view for describing an image captured by the photographing module of FIG. 1. FIG. 3 describes an image obtained by capturing region A of FIG. 2.

Referring to FIGS. 1 to 3, a device 1 for measuring a gap according to some embodiments of the present disclosure includes an analysis unit 10 and a measurement unit 20.

The measurement unit 20 measures the equipment to be measured including the first member 240 and the second member 220. A gap G exists between the first member 240 and the second member 220. The second member 220 may be in the form of a circular plate, and the first member 240 may be in the form of a ring surrounding the circular plate, but is not limited thereto. The equipment to be measured may be an electrostatic chuck installed in the substrate processing apparatus, and in this case, the second member 220 may be a support member (e.g., a dielectric plate, on which an electrode and/or a heater is installed), on which a substrate is mounted, and the first member 240 may be an edge ring (or focus ring).

The measurement unit 20 captures the equipment to be measured while irradiating a laser to the equipment to be measured. The measurement unit 20 may have a wafer-shaped body. A light emitting module 24, a photographing module 26, a communication module 29, and a controller 22 may be installed in the body. That is, the measurement unit 20 may be in the form of a vision wafer. After the measurement unit 20 is introduced into the chamber by the robot arm (see 30 of FIG. 2), the measurement unit 20 may capture the equipment to be measured while the measurement unit 20 is located on the equipment to be measured.

The controller 22 controls the light emitting module 24, the photographing module 26, the communication module 29, and the like.

The light emitting module 24 irradiates light (e.g., a laser) to the equipment to be measured. The light emitting module 24 may irradiate light in an inclined direction (i.e., an oblique direction), but is not limited thereto.

The photographing module 26 captures the equipment to be measured. In particular, while the laser is irradiated to the equipment to be measured by the light emitting module 24, the photographing module 26 may capture the equipment to be measured.

Here, referring to FIG. 3, the images captured by the photographing module 26 may include a first member 240, a first laser line image 91 corresponding to the surface of the first member 240, a second member 220, a second laser line image 92 corresponding to the surface of the second member 220, and a gap G between the first member 240 and the second member 220.

The first laser line image 91 is an image generated near the surface of the first member 240 by the irradiated laser, and the width may vary according to the amount of scattering of the laser. The second laser line image 92 is an image generated near the surface of the second member 220 by the irradiated laser, and the width may vary according to the amount of scattering.

In the captured image, the first member 240 and the second member 220 are adjacent in the first direction X. Alternatively, the surface of the first member 240 and the surface of the second member 220 may be parallel to the first direction X. Also, the widths of the first laser line image 91 and the second laser line image 92 may be measured in the second direction Y (i.e., a direction perpendicular to the first direction X).

When the amount of scattering is appropriate, as shown in FIG. 3, the first laser line image 91 and the second laser line image 92 are clearly distinguished, and the gap G between the first member 240 and the second member 220 can be accurately measured. On the other hand, when the amount of scattering is large, the first laser line image 91 and the second laser line image 92 stick together or the boundary becomes unclear, so that the gap between the first member 240 and the second member 220 cannot be accurately measured. In the gap measuring device according to some embodiments of the present disclosure, the gap G between the first member 240 and the second member 220 is accurately measured by appropriately adjusting the amount of scattering. This method will be described in detail later with reference to FIGS. 4 to 10.

As the setting of the photographing module 26 is changed, an image capturing the equipment to be measured may vary. For example, the setting of the photographing module 26 may be a shutter speed and/or a gain. If the shutter speed is increased or the gain is decreased, the amount of scattering by the laser decreases in the captured image. On the other hand, if the shutter speed is decreased or the gain is increased, the amount of scattering by the laser increases in the captured image.

The communication module 29 is a module for communicating with the analysis unit 10. It provides an image captured by the photographing module 26 to the analysis unit 10, and receives a command (or instruction) for controlling the photographing module 26 and/or the light emitting module 24 from the analysis unit 10. The command may be, for example, a command to increase or decrease the shutter speed of the photographing module 26, a command to increase or decrease the gain of the photographing module 26, a command to increase or decrease the light intensity of the light emitting module 24, a command to adjust the light irradiation angle of the light emitting module 24, a measurement start/end command, or the like.

The communication module 29 is capable of wireless communication or wired communication. In particular, wireless communication includes both wired and wireless methods. In particular, wireless communication may include at least one of WiFi (wireless fidelity), LiFi (light fidelity), Bluetooth, Bluetooth low energy (BLE), Zigbee, NFC (near field communication), magnetic secure transmission, radio frequency (RF) or a body area network (BAN). Alternatively, wireless communication may include, for example, cellular communication using at least one of LTE, LTE Advance (LTE-A), code division multiple access (CDMA), wideband CDMA (WCDMA), universal mobile telecommunications system (UMTS), Wireless Broadband (WiBro), or GSM (Global System for Mobile Communications). Alternatively, the wireless communication may include GNSS. The GNSS may be, for example, a Global Positioning System (GPS), a Global Navigation Satellite System (Glonass), a Beidou Navigation Satellite System (hereinafter, "Beidou"), Galileo, or the European global satellite-based navigation system. Wired communication may include, for example, at least on of universal serial bus (USB), high definition multimedia interface (HDMI), recommended standard232 (RS-232), power line communication, or plain old telephone service (POTS), computer network (e.g., LAN or WAN) and the like.

The analysis unit 10 analyzes the image received from the measurement unit 20, and generates/transmits a command for controlling the measurement unit 20.

When the boundary between the first laser line image 91 and the second laser line image 92 in the received image is clear, the analysis unit 10 calculates the gap G between the first member 240 and the second member 220 through the image analysis.

On the other hand, when the boundary between the first laser line image 91 and the second laser line image 92 in the received image is unclear, the analysis unit 10 provides a command for changing the setting of the photographing module 26 to the measurement unit 20.

Specifically, the analysis unit 10 may determine whether to change the setting of the photographing module 26 based on the maximum width of the second laser line image 92. For example, the maximum width of the second laser line image 92 is calculated, and when the maximum width is greater than the upper limit of the preset first range, the camera shutter speed of the photographing module 26 is increased or the gain is decreased. When the maximum width is smaller than the lower limit of the preset first range, the camera shutter speed of the photographing module 26 may be decreased or the gain may be increased.

This analysis unit 10 includes a processor 12, a memory 14 and a communication module 19.

Memory 14 may include a volatile memory (e.g., DRAM, SRAM, or SDRAM) and/or a non-volatile memory (e.g., one time programmable ROM (OTPROM), PROM, EPROM, EEPROM, mask ROM, flash ROM, flash memory, PRAM, RRAM, MRAM, hard drive, or solid state drive (SSD)). Memory 14 may include internal memory and/or external memory. The memory 14 may store, for example, commands or data related to at least one other component of the electronic device 260. The memory 14 may also store software and/or programs. A program may include, for example, a kernel, middleware, an application programming interface (API), and/or an application program (or "application"), and the like. At least a portion of the kernel, middleware, or API may be referred to as an operating system.

The memory 14 stores instructions for the processor 12 to perform a gap measurement method, which will be described later with reference to FIGS. 4 to 10.

For example, the memory 14 may comprise instructions for preparing an equipment to be measured including a first member and a second member, obtaining a first image by capturing the equipment to be measured using a photographing module of a first setting while irradiating a laser to the equipment to be measured, wherein the first image includes a first laser line image corresponding to a surface of the first member and a second laser line image corresponding to the surface of the second member, modifying the photographing module from the first setting to a second setting based on a maximum width of the second laser line image in the first image, obtaining a second image by capturing the equipment to be measured using the photographing module of the second setting while irradiating a laser to the equipment to be measured, and calculating a gap between the first member and the second member based on a discontinuous region between the first laser line image and the second laser line image in the second image.

Further, the memory 14 may comprise instructions for preparing an equipment to be measured including an edge ring and a support member disposed inside the edge ring, placing a vision wafer on the equipment to be measured by a robot arm, wherein the vision wafer includes a light emitting module capable of irradiating a laser to the equipment to be measured, and a photographing module capable of capturing the equipment to be measured, obtaining a first image by capturing the equipment to be measured using a photographing module of a first setting while the light emitting module irradiates a laser to the equipment to be measured, wherein the first image includes a first laser line image corresponding to a surface of the edge ring and a second laser line image corresponding to a surface of the support member, calculating a maximum width of the second laser line image in the first image, increasing a camera shutter speed of the photographing module or decreasing a gain based on the maximum width being greater than an upper limit of a preset first range, and decreasing a camera shutter speed of the photographing module or increasing a gain based on the maximum width being smaller than a lower limit of a preset first range.

Figure 4:
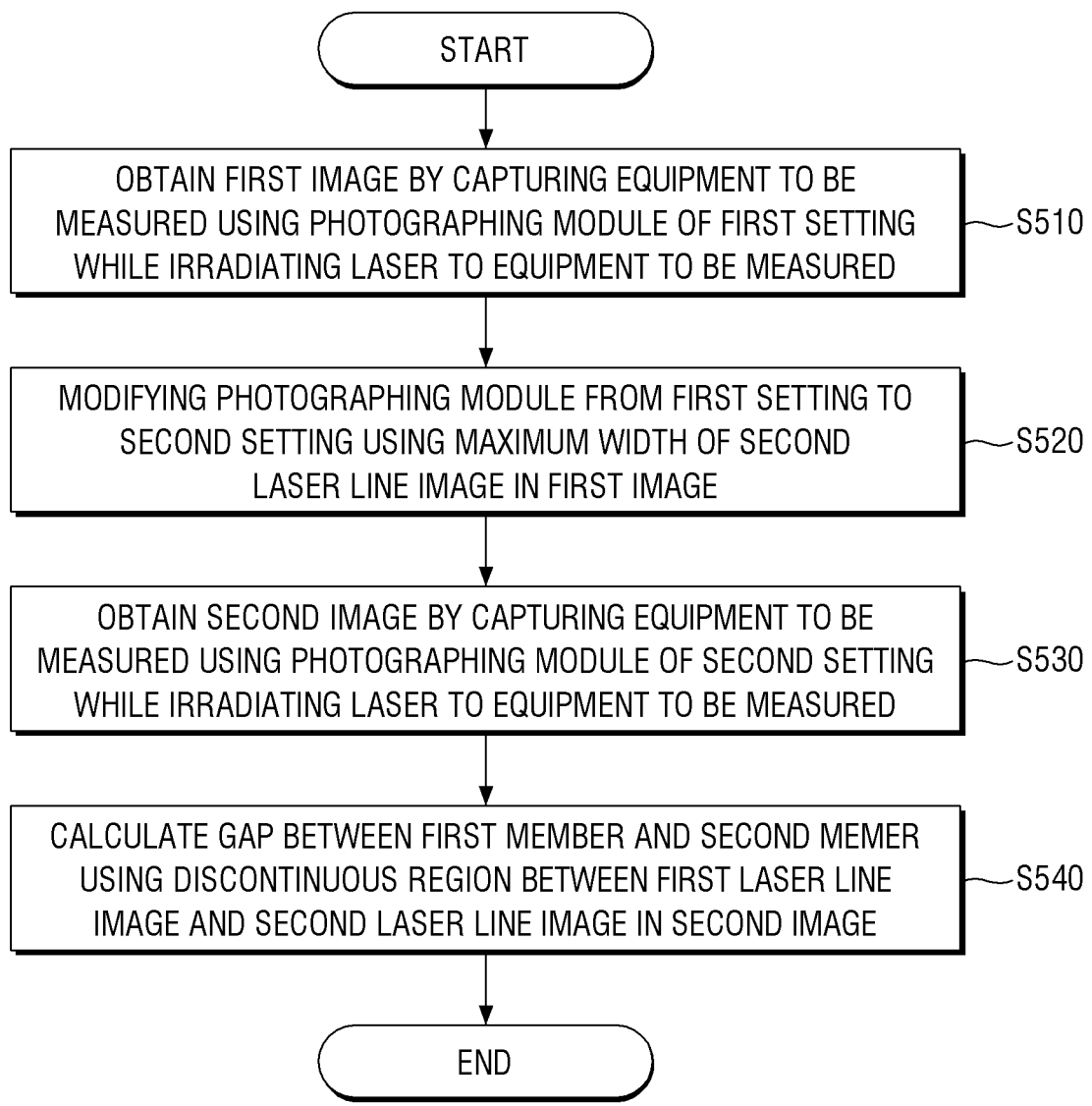
FIG. 4 is a flowchart illustrating a method for measuring a gap according to an embodiment of the present disclosure.
Figure 5:
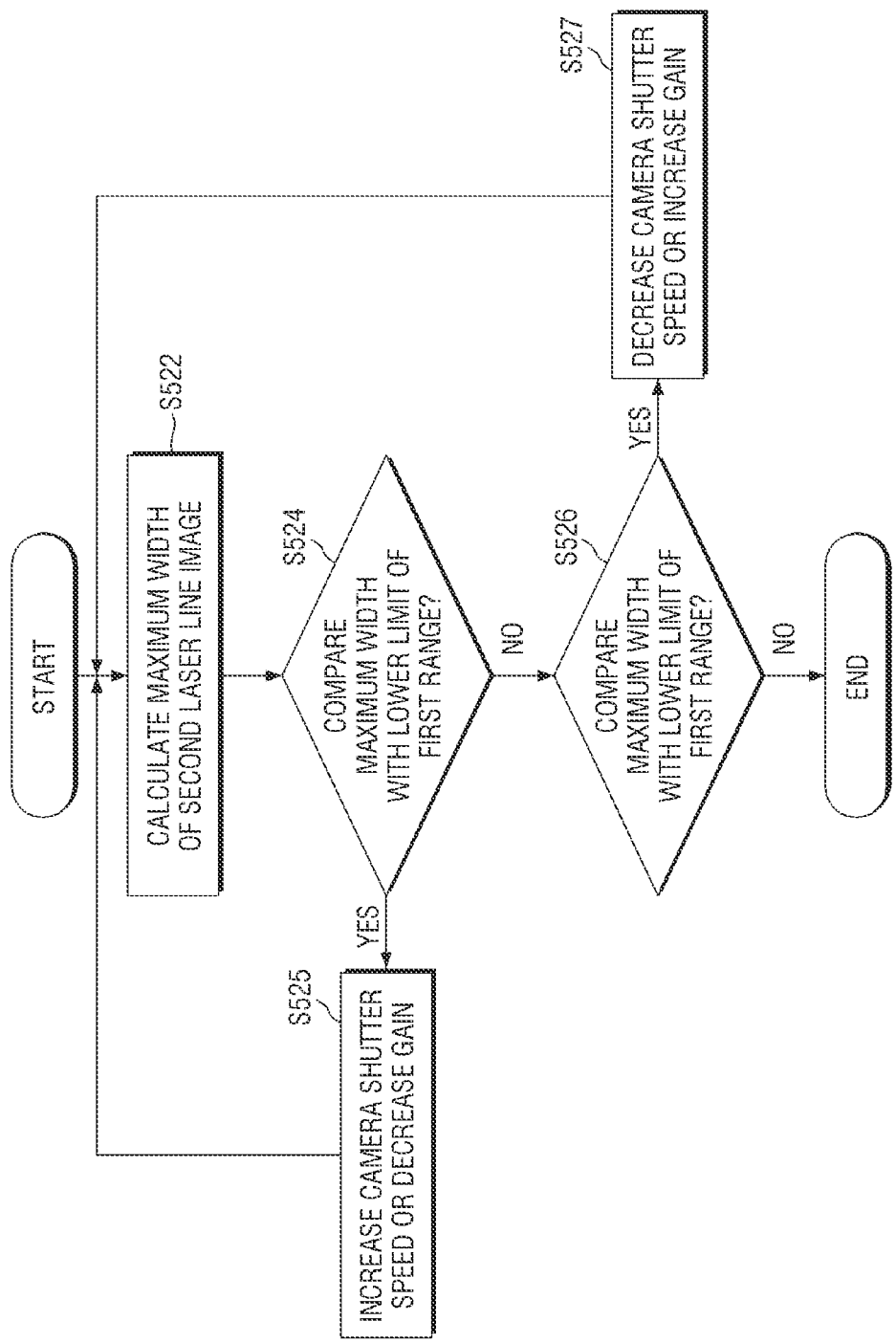
FIG. 5 is a flowchart illustrating a method for adjusting settings of a photographing module.
Figure 7:
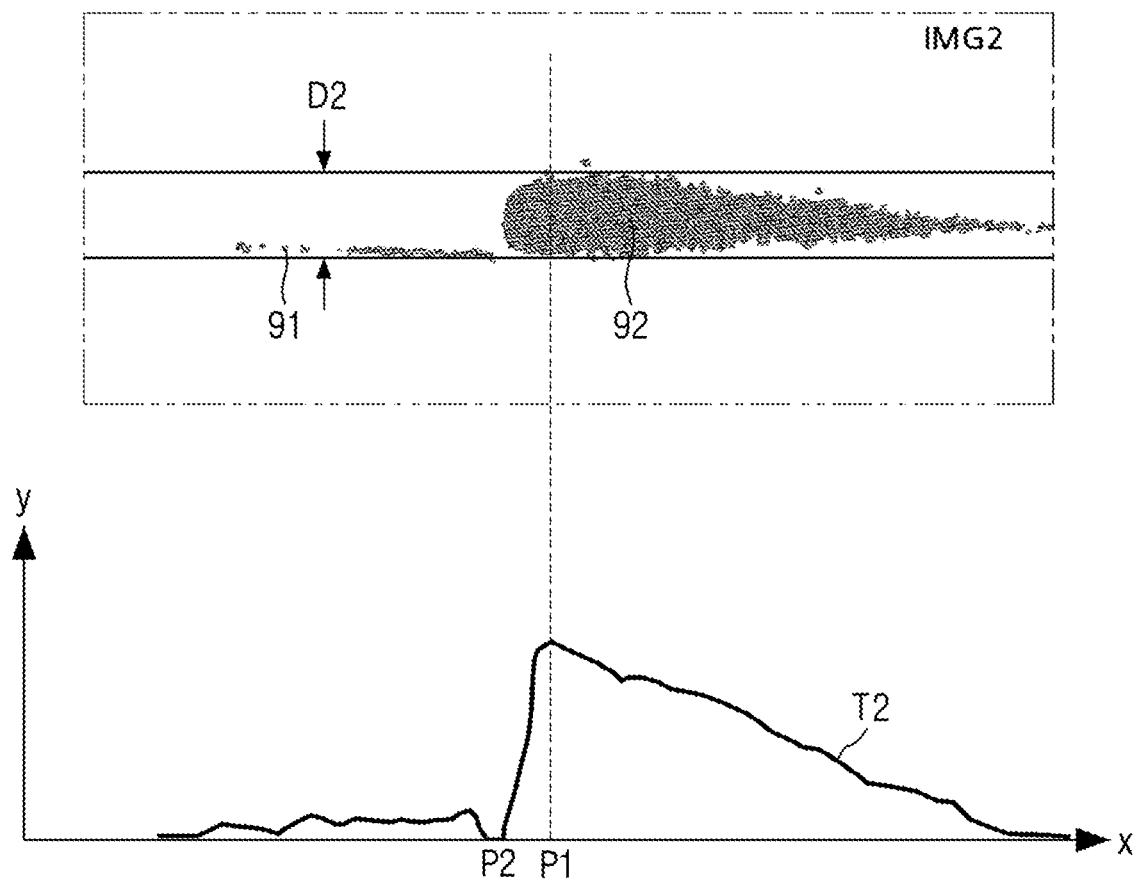
FIG. 7 is a diagram for describing a third image obtained in step S530 of FIG. 4.

FIGS. 1, 4 to 7 will describe a method for measuring a gap according to an embodiment of the present disclosure. FIG. 4 is a flowchart illustrating a method for measuring a gap according to an embodiment of the present disclosure. FIG. 5 is a flowchart illustrating a method for adjusting settings of a photographing module. FIG. 6 is a diagram for describing the first image obtained in step S510 of FIG. 4, and FIG. 7 is a diagram for describing the third image obtained in step S530 of FIG. 4.

First, referring to FIGS. 4 and 6, an equipment to be measured including a first member (e.g., an edge ring, a focus ring) and a second member (e.g., a dielectric plate) is prepared. A first image (IMG1 in FIG. 6) is obtained by capturing the equipment to be measured using the photographing module 26 of the first setting while irradiating a laser to the equipment to be measured with the light emitting module 24 and (S510).

Specifically, the first setting of the photographing module 26 may be a setting for a camera shutter speed and a gain. The camera shutter speed may be the first speed, or the gain may be the first gain.

The first image (IMG1 in FIG. 6) captured by the photographing module 26 of the first setting includes the first laser line image 91 corresponding to the surface of the first member 240 and a second laser line image 92 corresponding to the surface of the second member 220. As shown in FIG. 6, the first laser line image 91 and the second laser line image 92 may stick together or the boundary may be unclear.

The graph T1 shown below the first image IMG1 shows widths measured from the first image IMG1 according to positions of the first and second laser line images 91 and 92. The graph T1 is enlarged compared to the first image IMG1 for convenience of description.

Next, referring to FIGS. 4 and 6, using the maximum width D1 of the second laser line image 92 in the first image IMG1, the photographing module 26 is modified from the first setting to the second setting (S520).

Specifically, the maximum width D1 of the second laser line image 92 is measured at the position P1. In addition, changing the photographing module 26 from the first setting to the second setting may include modifying the camera shutter speed of the photographing module 26 from the first speed to the second speed, or modifying the gain of the photographing module 26 from the first gain to the second gain.

Here, a method of adjusting the settings of the photographing module 26 using the maximum width D1 will be described in detail with reference to FIG. 5.

The maximum width D1 of the second laser line image 92 is calculated (S522).

It is determined whether the maximum width D1 is greater than an upper limit of a preset first range (S524).

If the maximum width D1 is greater than the upper limit of the preset first range (YES in S524), the camera shutter speed of the photographing module 26 is increased or the gain is decreased (S525). By doing this, the amount of light entering the photographing module 26 is decreased, thereby decreasing the amount of scattering by the laser.

If the maximum width D1 is smaller than the upper limit of the preset first range (NO in S524), it is determined whether the maximum width D1 is smaller than the lower limit of the preset first range (S526). When the maximum width D1 is smaller than the lower limit of the preset first range (YES in S526), the camera shutter speed of the photographing module 26 is decreased or the gain is increased (S527). By doing this, the amount of light entering the photographing module 26 is increased, thereby increasing the amount of scattering by the laser.

If the maximum width D1 is greater than the lower limit of the preset first range (NO in S526), the maximum width D1 falls within the preset first range, and thus the adjustment setting of the photographing module 26 is unnecessary.

Referring back to FIGS. 4 and 7, a second image (IMG2 in FIG. 7) is obtained by capturing the equipment to be measured using the photographing module 26 of the second setting while irradiating a laser to the equipment to be measured with the light emitting module 24.

Specifically, the second image (IMG2 in FIG. 6) captured by the photographing module 26 of the second setting includes the first laser line image 91 corresponding to the surface of the first member 240 and a second laser line image 92 corresponding to the surface of the second member 220. As shown in FIG. 7, it can be seen that the first laser line image 91 and the second laser line image 92 are separated from each other.

The graph T2 shown below the second image IMG2 shows widths measured from the second image IMG2 according to positions of the first and second laser line images 91 and 92. The graph T2 is enlarged compared to the second image IMG2 for convenience of description.

Then, referring to FIGS. 4 and 7, the gap between the first member 240 and the second member 220 is calculated by using the discontinuous region between the first laser line image 91 and the second laser line image 92 in the second image IMG2.

Specifically, the gap between the first member 240 and the second member 220 may be calculated using the second image IMG2. That is, a discontinuous region between the first laser line image 91 and the second laser line image 92 is measured, and the measured length may correspond to the gap between the first member 240 and the second member 220. Alternatively, in the graph T2 generated from the second image IMG2, the discontinuous region P2 between the first and second laser line images 91 and 92 may be identified, and the discontinuous region P2 may be measured in the graph T2, and the measured length may correspond to the gap between the first member 240 and the second member 220.

In summary, the maximum width D2 of the second laser line image 92 is calculated in the first image IMG1 captured using the photographing module 26 of the first setting, and the setting of the photographing module 26 is adjusted to the second setting so that the maximum width D2 falls within the preset first range. The gap between the first member 240 and the second member 220 may be measured in the second image IMG2 obtained by re-capturing with the photographing module 26 of the second setting.

Figure 8:
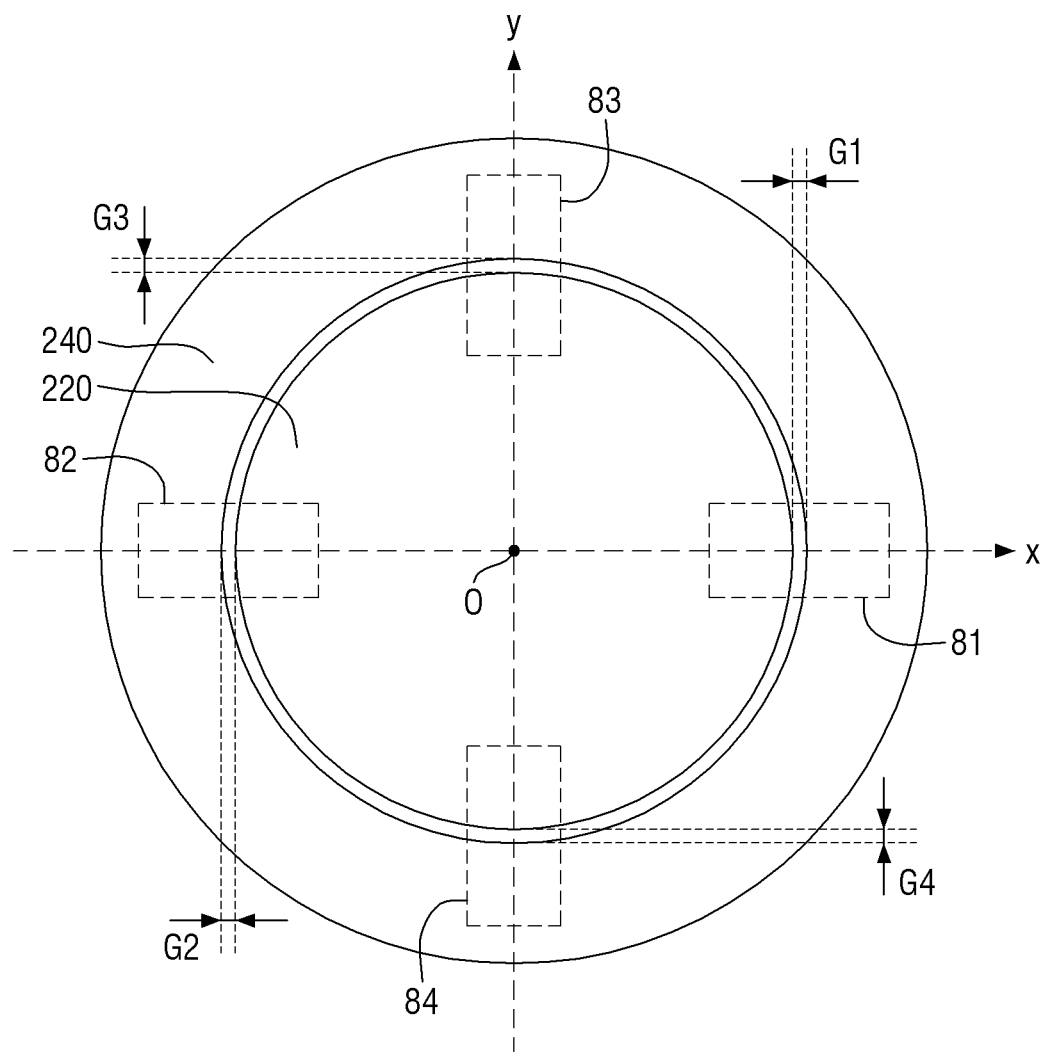
FIG. 8 is a view for describing a method for measuring a gap according to another embodiment of the present disclosure.

FIG. 8 is a view for describing a method for measuring a gap according to another embodiment of the present invention. For convenience of description, the points different from those described with reference to FIGS. 1 to 7 will be mainly described.

Referring to FIGS. 4 and 8, the equipment to be measured includes a first member 240 and a second member. The second member 220 may be in the form of a circular plate (e.g., a support member (dielectric plate) disposed inside the edge ring of the chuck), and the first member 240 may be in the form of a ring surrounding the circular plate (e.g., an edge ring of the chuck).

A plurality of first images IMG1 are obtained by capturing a plurality of spaces 81, 82, 83, and 84 between the first member 240 and the second member 220 using the photographing module of the first setting while irradiating a laser to the equipment to be measured (see S510 of FIG. 4).

The plurality of first images IMG1 may be images captured in spaces 81 and 82 corresponding to 0° and 180° in virtual coordinates with respect to the center of the circular plate O. Alternatively, the images may be images captured in spaces 83 and 84 corresponding to 90° and 270° in virtual coordinates. That is, it is possible to capture spaces symmetrical to the origin in virtual coordinates.

Then, in each of the plurality of first images, the photographing module 26 is modified from the first setting to the second setting by using the maximum width of the second laser line image 92 (see S520 of FIG. 4).

Next, a plurality of second images IMG2 are obtained by re-capturing the plurality of spaces 81, 82, 83, and 84 between the first member 240 and the second member 220 using the photographing module of the second setting while irradiating a laser to the equipment to be measured (see S530 of FIG. 4).

Then, a plurality of gaps are calculated in each of the plurality of second images IMG2 (see S540 of FIG. 4). For example, when the gaps G1, G2, G3, and G4 in each of the plurality of spaces 81, 82, 83, and 84 are within a preset range, it is determined that the installation of the first member 240 and the second member 220 are appropriate. On the other hand, when at least one of the gaps G1, G2, G3, and G4 calculated in each of the plurality of spaces 81, 82, 83, and 84 is out of a preset range, the first member 240 and/or the second member 220 should be reinstalled. For example, when the gap G1 is very small compared to the gap G2, it can be seen that the second member 220 is biased to the right when viewed in FIG. 8. Alternatively, when the gap G3 is very small compared to the gap G4, it can be seen that the second member 220 is biased upward when viewed in FIG. 8. That is, by capturing spaces (e.g., 81 and 82) symmetric to the origin in virtual coordinates, it is possible to determine whether the second member 220 is biased.

Figure 9:
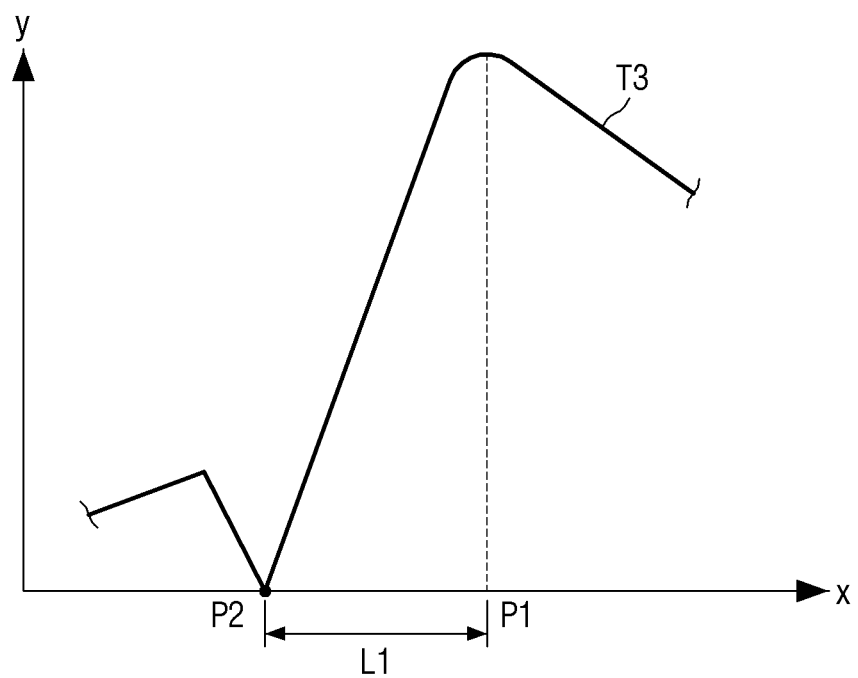
FIG. 9 is a view for describing a method for measuring a gap according to another embodiment of the present disclosure.

FIG. 9 is a view for describing a method for measuring a gap according to another embodiment of the present invention. This is to describe a method for adjusting the settings of the photographing module using the first image.

Referring to FIG. 9, a first image IMG1 is obtained by capturing the equipment to be measured using the photographing module 26 of the first setting. The graph T3 shows widths measured from the first image IMG1 according to positions of the first and second laser line images 91 and 92.

In the graph T3, the maximum width and the minimum width are calculated in the region between the first laser line image 91 and the second laser line image 92, and the setting of the photographing module may be adjusted using the maximum and minimum widths. In the graph T3, the minimum width is measured at the position P2 and the maximum width is measured at the position P1. The distance L1 between the position P1 corresponding to the maximum width and the position P2 corresponding to the minimum width is measured. The setting of the photographing module 26 may be modified so that the distance L1 falls within the present second range.

For example, when the distance L1 is smaller than the lower limit of the preset second range, the shutter speed of the photographing module 26 may be increased or the gain may be decreased. By doing this, it is possible to decrease the amount of light entering the photographing module 26, decrease the amount of scattering by the laser, and increase the distance L1.

Alternatively, when the distance L1 is greater than the upper limit of the preset second range, the camera shutter speed of the photographing module 26 may be decreased or the gain may be increased. By doing this, it is possible to increase the amount of light entering the photographing module 26, increase the amount of scattering by the laser, and decrease the distance L1.

Figure 10:
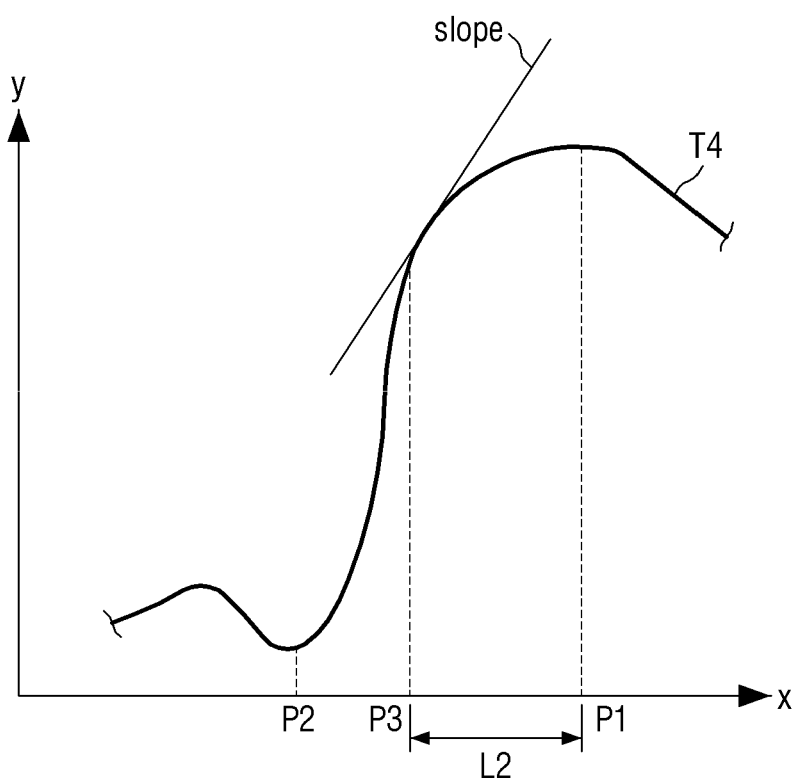
FIG. 10 is a view for describing a method for measuring a gap according to another embodiment of the present disclosure.

FIG. 10 is a view for describing a method for measuring a gap according to another embodiment of the present disclosure. This is to describe a method for adjusting the settings of the photographing module using the first image.

Referring to FIG. 10, a first image IMG1 is obtained by capturing the equipment to be measured using the photographing module 26 of the first setting. The graph T4 shows widths measured from the first image IMG1 according to positions of the first and second laser line images 91 and 92.

In the graph T4, the maximum width and the minimum width are calculated in the region between the first laser line image 91 and the second laser line image 92, and the slope of the graph between the minimum width and the maximum width is calculated, and the setting of the photographing module may be adjusted by using the maximum and minimum widths.

Specifically, in the graph T4, the minimum width is measured at the position P2, and the maximum width is measured at the position P1. The slope (i.e., the tangential slope or instantaneous rate of change) is calculated by differentiating the graph T4 between the position P2 and the position P1. The maximum slope at position P3 is calculated. The setting of the photographing module 26 may be modified so that the distance L2 between the position P3 corresponding to the maximum slope and the position P1 corresponding to the maximum width falls within the preset third range.

The method described using FIG. 9 should be able to accurately determine the minimum width because the distance L1 between the position P1 corresponding to the maximum width and the position P2 corresponding to the minimum width should be measured. This is because the position P2 corresponding to the minimum width can also be determined by doing so. However, depending on the state of the first image IMG1, the minimum width may not be clearly determined. In this case, the method described using FIG. 10 can be used. This is because even if the minimum width cannot be clearly determined, the position P3 corresponding to the maximum slope can be obtained by calculating the slope (tangential slope) of the graph T4.

For example, when the distance L2 is smaller than the lower limit of the preset second range, the shutter speed of the photographing module 26 may be increased or the gain may be decreased. By doing this, it is possible to decrease the amount of light entering the photographing module 26, decrease the amount of scattering by the laser, and increase the distance L2.

Alternatively, when the distance L2 is greater than the upper limit of the preset second range, the camera shutter speed of the photographing module 26 may be decreased or the gain may be increased. By doing this, it is possible to increase the amount of light entering the photographing module 26, increase the amount of scattering by the laser, and decrease the distance L2.

Although embodiments of the present invention have been described with reference to the above and the accompanying drawings, it could be understood that those of ordinary skill in the art to which the present invention pertains can practice the present invention in other specific forms without changing its technical spirit or essential features. Therefore, it should be understood that the embodiments described above are illustrative in all respects and not limiting.

What is claimed is:

1. A method for measuring a gap comprising:
preparing an equipment to be measured including a first member and a second member;
obtaining a first image by capturing the equipment to be measured using a photographing module of a first setting while irradiating a laser to the equipment to be measured, wherein the first image includes a first laser line image corresponding to a surface of the first member and a second laser line image corresponding to a surface of the second member;
modifying the photographing module from the first setting to a second setting based on a maximum width of the second laser line image in the first image;
obtaining a second image by capturing the equipment to be measured using the photographing module of the second setting while irradiating a laser to the equipment to be measured; and
calculating a gap between the first member and the second member based on a discontinuous region between the first laser line image and the second laser line image in the second image.

2. The method of claim 1, wherein modifying the photographing module from the first setting to a second setting comprises,
modifying a camera shutter speed of the photographing module from a first speed to a second speed.

3. The method of claim 1, wherein modifying the photographing module from the first setting to a second setting comprises,
modifying a gain of the photographing module from a first gain to a second gain.

4. The method of claim 1, wherein modifying the photographing module from the first setting to a second setting based on a maximum width of the second laser line image in the first image comprises,
calculating a maximum width of the second laser line image, and
increasing a camera shutter speed of the photographing module or decreasing a gain based on the maximum width being greater than an upper limit of a preset first range.

5. The method of claim 4 further comprises,
decreasing a camera shutter speed of the photographing module or increasing a gain based on the maximum width being smaller than a lower limit of a preset first range.

6. The method of claim 1, wherein modifying the photographing module from the first setting to a second setting based on a maximum width of the second laser line image in the first image comprises,
calculating a minimum width in a region between the first laser line image and the second laser line image, and
modifying the photographing module from the first setting to the second setting based on the maximum width and the minimum width.

7. The method of claim 6, wherein modifying the photographing module from the first setting to a second setting based on the maximum width and the minimum width comprises,
modifying the photographing module from the first setting to the second setting so that a distance between a first position corresponding to the maximum width and a second position corresponding to the minimum width falls within a preset second range.

8. The method of claim 6, wherein modifying the photographing module from the first setting to the second setting based on the maximum width and the minimum width comprises,
calculating a graph indicating a width measured according to positions of the first and second laser line images from the first image,
calculating a slope of a tangent line of a graph between the minimum width and the maximum width in the graph, and
modifying the photographing module from the first setting to the second setting so that a distance between a first position corresponding to the maximum width and a third position corresponding to a maximum slope among the calculated tangential slopes falls within a preset third range.

9. The method of claim 1, wherein the second member is in the form of a circular plate,
wherein the first member is in the form of a ring surrounding the circular plate,
wherein obtaining the first image comprises obtaining a plurality of first images by capturing a plurality of spaces between the first member and the second member,
wherein the plurality of first images are images captured in spaces symmetrical to an origin in virtual coordinates with respect to a center of the circular plate.

10. The method of claim 9, wherein obtaining the second image comprises obtaining a plurality of second images by re-capturing a plurality of spaces captured to obtain the plurality of first images,
wherein calculating a gap between the first member and the second member further comprises,
calculating a plurality of gaps in each of the plurality of second images, and
reinstalling at least one of the first member and the second member in response to the calculated plurality of gaps being out of a preset range.

11. The method of claim 1, wherein the first member is an edge ring of a chuck,
wherein the second member is a support member disposed inside the edge ring of the chuck.

12. The method of claim 11, wherein, in a state, in which a robot arm places a vision wafer on the first member and the second member, the first image and the second image are obtained by using the vision wafer,
wherein the vision wafer comprises,
a wafer-shaped body,
a light emitting module installed on the body and capable of irradiating a laser to the equipment to be measured, and
a photographing module installed on the body and capable of capturing the equipment to be measured.

13. A method for measuring a gap comprising:
preparing an equipment to be measured including an edge ring and a support member disposed inside the edge ring;
placing, by a robot arm, a vision wafer on the equipment to be measured, wherein the vision wafer includes a light emitting module capable of irradiating a laser to the equipment to be measured, and a photographing module capable of capturing the equipment to be measured;
obtaining a first image by capturing the equipment to be measured using a photographing module of a first setting while the light emitting module irradiates a laser to the equipment to be measured, wherein the first image includes a first laser line image corresponding to a surface of the edge ring and a second laser line image corresponding to a surface of the support member;

calculating a maximum width of the second laser line image in the first image;

increasing a camera shutter speed of the photographing module or decreasing a gain based on the maximum width being greater than an upper limit of a preset first range; and decreasing a camera shutter speed of the photographing module or increasing a gain based on the maximum width being smaller than a lower limit of a preset first range.

14. The method of claim 13, wherein obtaining the first image comprises obtaining a plurality of first images by capturing a plurality of spaces between the edge ring and the support member, wherein the plurality of first images are images captured in spaces symmetrical to an origin in virtual coordinates with respect to a center of a circular plate.

15. An apparatus for measuring a gap comprising:
a measurement unit including a light emitting module and a photographing module; and
an analysis unit for analyzing an image captured by the measurement unit,
wherein the measurement unit obtains a first image by capturing an equipment to be measured including a first member and a second member using a photographing module of a first setting while irradiating a laser to the equipment to be measured with the light emitting module,
wherein the first image includes a first laser line image corresponding to a surface of the first member and a second laser line image corresponding to a surface of the second member,
wherein the analysis unit determines whether to change a setting of the photographing module based on a maximum width of the second laser line image in the first image,
wherein the analysis unit instructs the measurement unit to modify the photographing module from the first setting to a second setting,
wherein the measurement unit obtains a second image by capturing the equipment to be measured using the photographing module of the second setting while irradiating a laser to the equipment to be measured with the light emitting module,
wherein the analysis unit calculates a gap between the first member and the second member based on a discontinuous region between the first laser line image and the second laser line image in the second image.

16. The apparatus of claim 15, wherein modifying the photographing module from the first setting to a second setting comprises,
modifying a camera shutter speed of the photographing module from a first speed to a second speed, or modifying a gain of the photographing module from a first gain to a second gain.

17. The apparatus of claim 15, wherein determining, by the analysis unit, whether to change a setting of the photographing module based on a maximum width of the second laser line image in the first image comprises,
calculating a minimum width in a region between the first laser line image and the second laser line image, and
determining whether to modify the photographing module from the first setting to the second setting based on the maximum width and the minimum width.

18. The apparatus of claim 17, wherein determining whether to modify the photographing module from the first setting to a second setting based on the maximum width and the minimum width comprises, P1 determining whether to modify based on whether a distance between a first position corresponding to the maximum width and a second position corresponding to the minimum width falls within a preset second range.

19. The apparatus of claim 17, wherein modifying the photographing module from the first setting to a second setting based on the maximum width and the minimum width comprises,
calculating a graph indicating a width measured according to positions of the first and second laser line images from the first image,
calculating a slope of a tangent line of a graph between the minimum width and the maximum width in the graph, and
determining whether to modify based on whether a distance between a first position corresponding to the maximum width and a third position corresponding to a maximum slope among the calculated tangential slopes falls within a preset third range.

* * * * *